United States Patent
Ma et al.

(10) Patent No.: US 9,953,721 B2
(45) Date of Patent: Apr. 24, 2018

(54) GATE DRIVER CIRCUIT, TOUCH DISPLAY DEVICE AND TOUCH DISPLAY DRIVING METHOD

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lei Ma, Beijing (CN); Dong Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/129,866

(22) PCT Filed: Jan. 26, 2016

(86) PCT No.: PCT/CN2016/072088
§ 371 (c)(1),
(2) Date: Sep. 28, 2016

(87) PCT Pub. No.: WO2017/008499
PCT Pub. Date: Jan. 19, 2017

(65) Prior Publication Data
US 2017/0178749 A1 Jun. 22, 2017

(30) Foreign Application Priority Data

Jul. 10, 2015 (CN) .......................... 2015 1 0405456

(51) Int. Cl.
*G11C 19/28* (2006.01)
*G09G 3/20* (2006.01)
(Continued)

(52) U.S. Cl.
CPC ........ *G11C 19/287* (2013.01); *G02F 1/13338* (2013.01); *G06F 3/0412* (2013.01);
(Continued)

(58) Field of Classification Search
CPC ... G11C 19/287; G06F 3/0416; G06F 3/0412; G02F 1/13338; G09G 3/2096; G09G 2310/0286
See application file for complete search history.

(56) References Cited

U.S. PATENT DOCUMENTS

2011/0012823 A1   1/2011   Tsai et al.
2012/0182050 A1   7/2012   Yang et al.
(Continued)

FOREIGN PATENT DOCUMENTS

CN   103943055 A   7/2014
CN   103943083 A   7/2014
(Continued)

OTHER PUBLICATIONS

Form PCT/ISA/210 issued in corresponding international application No. PCT-CN2016-072088 dated May 3, 2016.
(Continued)

*Primary Examiner* — Abhishek Sarma
(74) *Attorney, Agent, or Firm* — Nath, Goldberg & Meyer; Joshua B. Goldberg; Scott Blackman (57) ABSTRACT

Embodiments of the present invention provide a gate driver circuit, a touch display device and a touch display driving method. The gate driver circuit includes a plurality of GOA unit groups arranged successively and control units arranged between every two adjacent GOA unit groups, each of the GOA unit groups comprising a plurality of shift registers which are cascaded. The control unit is configured to output a start control signal at a high level to a signal input end of a first stage shift register of a next GOA unit group corre-
(Continued)

sponding thereto, after a last stage shift register of a previous GOA unit group corresponding thereto completes driving for a corresponding gate line and a predetermined time elapses, so as to pre-charge the first stage shift register of the next GOA unit group.

12 Claims, 3 Drawing Sheets

(51) Int. Cl.
    *G02F 1/1333*     (2006.01)
    *G06F 3/041*     (2006.01)

(52) U.S. Cl.
    CPC ......... *G06F 3/0416* (2013.01); *G09G 3/2096* (2013.01); *G09G 2310/0286* (2013.01)

(56) References Cited

U.S. PATENT DOCUMENTS

| | | | |
|---|---|---|---|
| 2015/0279289 A1* | 10/2015 | Yu | G11C 19/28 345/690 |
| 2015/0371716 A1 | 12/2015 | Shao et al. | |
| 2016/0049126 A1* | 2/2016 | Zhang | G09G 3/3648 345/173 |
| 2016/0259455 A1* | 9/2016 | Li | G06F 3/0412 |
| 2016/0266700 A1* | 9/2016 | Ji | G06F 3/0412 |
| 2017/0010731 A1 | 1/2017 | Zhang et al. | |
| 2017/0255315 A1* | 9/2017 | Lin | G06F 3/0416 |

FOREIGN PATENT DOCUMENTS

| | | |
|---|---|---|
| CN | 203746393 U | 7/2014 |
| CN | 203760057 U | 8/2014 |
| CN | 104078017 A | 10/2014 |
| CN | 104318885 A | 1/2015 |
| CN | 104575436 A | 4/2015 |
| CN | 104916251 A | 9/2015 |

OTHER PUBLICATIONS

Form PCT/ISA/220 issued in corresponding international application No. PCT-CN2016-072088 dated May 3, 2016.
Form PCT/ISA/237 issued in corresponding international application No. PCT-CN2016-072088 dated May 3, 2016.
First Office Action dated Feb. 17, 2017 in corresponding Chinese Application No. 201510405456.0.
The Second Office Action dated Aug. 29, 2017 corresponding to Chinese application No. 201510405456.0.

\* cited by examiner

GATE DRIVER CIRCUIT, TOUCH DISPLAY DEVICE AND TOUCH DISPLAY DRIVING METHOD

This is a National Phase Application filed under 35 U.S.C. 371 as a national stage of PCT/CN2016/072088 filed on Jan. 26, 2016, an application claiming the benefit of Chinese Application No. 201510405456.0 filed on Jul. 10, 2015, the content of each of which is hereby incorporated by reference in its entirety.

TECHNICAL FIELD

The present invention relates to the field of display technology, and particularly relates to a gate driver circuit, a touch display device and a touch display driving method.

BACKGROUND

Existing In-Cell touch display devices have advantages such as good durability, high reliability and multi-touch, and have been widely used in the field of consumer electronics.

The operational procedure of the In-Cell touch display device generally includes a touch stage and a display stage, and the touch stage of the touch display device in the prior art only can be in a blank period between two adjacent frames. However, as increasing of the display resolution of a display panel, the blank period between two adjacent frames will be compressed, so that the blank period between the two adjacent frames cannot meet the time required for driving in the touch stage.

In order to solve the above problem in the prior art, by reducing driving time for each pixel unit so as to compress driving time in the display stage, the time required for driving in the touch stage is ensured. However, as the charging time for the pixel unit is reduced in the display stage, the pixel unit is undercharged, which will affect display of the display device.

From above it can be seen that how to realize normal touch recognition in the touch stage on the premise of ensuring that a touch display device having a high resolution can perform normal display in the display stage is a technical problem to be solved urgently by those skilled in the art.

SUMMARY

Embodiments of the present invention provide a gate driver circuit, a touch display device and a touch display driving method capable of realizing normal touch recognition in the touch stage on the premise of effectively ensuring that the touch display device can perform normal display in the display stage.

To achieve the above object, an embodiment of the present invention provides a gate driver circuit, including a plurality of GOA unit groups arranged successively and control units arranged between every two adjacent GOA unit groups, each of the GOA unit groups including a plurality of shift registers which are cascaded, wherein, the control unit is configured to output a start control signal at a high level to a signal input end of a first stage shift register of a next GOA unit group corresponding thereto, after a last stage shift register of a previous GOA unit group corresponding thereto completes driving for a corresponding gate line and a predetermined time elapses, so as to pre-charge the first stage shift register of the next GOA unit group.

The control unit may include a first transistor, a second transistor and a capacitor; a control electrode of the first transistor is connected with a first electrode of the first transistor and also connected with a signal output end of the last stage shift register of the previous GOA unit group, a second electrode of the first transistor is connected with a first end of the capacitor and a control electrode of the second transistor; a first electrode of the second transistor is connected with a start control signal output end, and a second electrode of the second transistor is connected with the signal input end of the first stage shift register of the next GOA unit group; a second end of the capacitor is grounded, or connected with a first power supply end, or connected with the second electrode of the second transistor; and the start control signal output end is configured to output the start control signal.

The control unit may further include a first reset module; the first reset module is connected with the first end of the capacitor and a signal output end of the first stage shift register of the next GOA unit group; and the first reset module is configured to reset the first end of the capacitor under the control of a signal output from the signal output end of the first stage shift register of the next GOA unit group.

The first reset module may include a third transistor; a control electrode of the third transistor is connected with the signal output end of the first stage shift register of the next GOA unit group, a first electrode of the third transistor is connected with a second power supply end, and a second electrode of the third transistor is connected with the first end of the capacitor.

In the case where the second end of the capacitor is grounded, or connected with the first power supply end, the control unit may further include a second reset module; the second reset module is connected with the signal input end of the first stage shift register of the next GOA unit group; and the second reset module is configured to reset the signal input end of the first stage shift register of the next GOA unit group, after the control unit completes the pre-charge of the first stage shift register of the next GOA unit group.

The second reset module may further include a fourth transistor; a control electrode of the fourth transistor is connected with a reset control signal end, a first electrode of the fourth transistor is connected with a third power supply end, and a second electrode of the fourth transistor is connected with the signal input end of the first stage shift register of the next GOA unit group.

To achieve the above object, an embodiment of the present invention further provides a touch display device, comprising the above-described gate driver circuit.

To achieve the above object, an embodiment of the present invention further provides a touch display driving method based on a touch display device comprising a touch driver circuit and the above gate driver circuit, comprising steps of:

in a first stage, driving a corresponding gate line by the last stage shift register of the previous GOA unit group, and outputting a voltage signal output from the signal output end of the last stage shift register of the previous GOA unit group to the control unit; in a second stage, performing a touch driving on the touch display device by the touch driver circuit, wherein duration of the second stage is the predetermined time; and in a third stage, outputting the start control signal at a high level to the signal input end of the first stage shift register of the next GOA unit group by the control unit under the control of the stored voltage signal output from the last stage shift register of the previous GOA unit group, so as to pre-charge the first stage shift register of the next GOA unit group.

After the third stage, the method may further comprise a step of:

in a fourth stage, driving a corresponding gate line by the first stage shift register of the next GOA unit group.

According to the gate driver circuit provided in embodiments of the present invention, the predetermined time period after the completion of driving by the last stage shift register of the previous GOA unit group can be used for touch driving, so that the time for touch driving is effectively increased, which in turn ensures the normal touch recognition of the touch display panel in the touch stage. Meanwhile, as the first stage shift register of the next GOA unit group can be pre-charged by the control unit after the last stage shift register of the previous GOA unit group completes driving and a predetermined time elapses, such that the first stage shift register of the next GOA unit group can perform normal driving on a corresponding gate line, it is ensured that the pixel unit corresponding to the first stage shift register of the next GOA unit group can perform normal display. Therefore, the technical solution of the present invention can realize normal touch recognition in the touch stage on the premise of effectively ensuring that the touch display device can perform normal display in the display stage.

DETAILED DESCRIPTION

To make those skilled in the art better understand the technical solutions of the present invention, the gate driver circuit, the touch display device and the touch display driving method provided in the embodiments of the present invention will be described below in detail in conjunction with the accompanying drawings.

Figure 1:
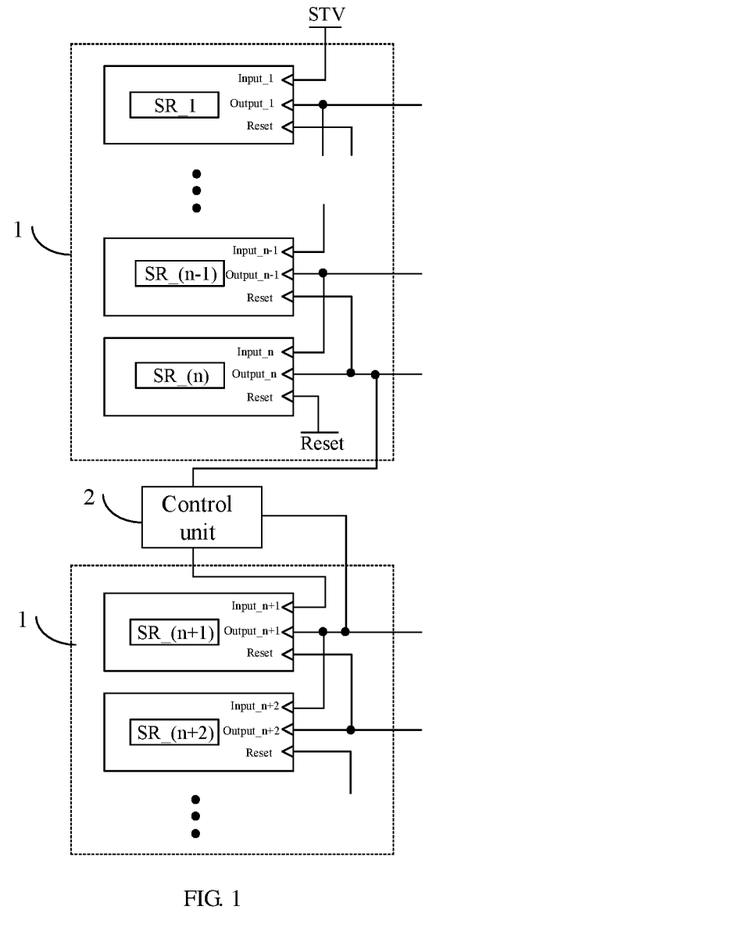
FIG. 1 is a structural diagram of a gate driver circuit according to an embodiment of the present invention.

FIG. 1 is a structural diagram of a gate driver circuit according to an embodiment of the present invention. As shown in FIG. 1, the gate driver circuit includes a plurality of GOA (Gate On Driver) unit groups 1 arranged successively and control units 2 arranged between every two adjacent GOA unit groups 1, and each of the GOA unit groups 1 includes a plurality of shift registers which are cascaded. For example, in FIG. 1, the GOA unit group 1 before the control unit 2 (hereinafter referred to as "previous GOA unit group") includes cascaded shift registers SR_1, SR_2, . . . , SR_n−1 and SR_n, and the GOA unit group 1 after the control unit 2 (hereinafter referred to as "next GOA unit group") includes cascaded shift registers SR_n+1, SR_n+2, . . . . The control unit 2 is configured to output a start control signal at a high level to a signal input end Input_n+1 of the first stage shift register SR_n+1 of the next GOA unit group, after the last stage shift register SR_n of the previous GOA unit group completes driving for a corresponding gate line and a predetermined time elapses, so as to pre-charge the first stage shift register SR_n+1 of the next GOA unit group.

It should be noted that those skilled in the art should understand that the last stage shift register SR_n of the previous GOA unit group and the first stage shift register SR_n+1 of the next GOA unit group, which correspond to a same control unit, are adjacent shift registers in two stages of the gate driver circuit.

In addition, the case that the gate driver circuit in FIG. 1 includes two GOA unit groups is only illustrated as an example. In this embodiment, all of the shift registers in the gate driver circuit can be divided into N (N≥2) GOA unit groups according to actual needs, and a control unit is arranged between any two adjacent GOA unit groups.

In the present invention, the predetermined time period after the completion of driving by the last stage shift register of the previous GOA unit group can be used for touch driving, so that the time for touch driving is effectively increased, which in turn ensures the normal touch recognition of the touch display panel in the touch stage. Meanwhile, as the first stage shift register of the next GOA unit group can be pre-charged by the control unit after the last stage shift register of the previous GOA unit group completes driving and a predetermined time elapses, such that the first stage shift register of the next GOA unit group can perform normal driving on a corresponding gate line, it is ensured that the pixel unit corresponding to the first stage shift register of the next GOA unit group can perform normal display. Therefore, the technical solution of the present invention can realize normal touch recognition in the touch stage on the premise of effectively ensuring that the touch display device can perform normal display in the display stage.

Figure 2:
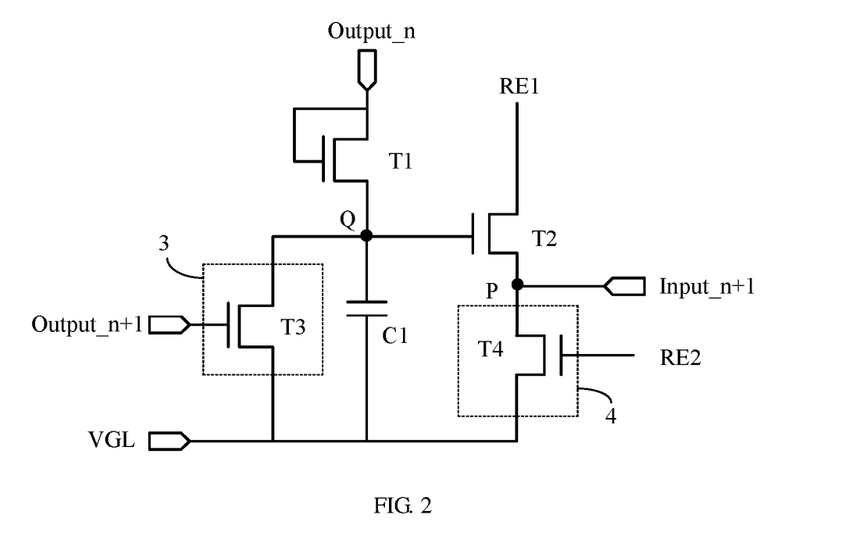
FIG. 2 is a structural diagram of a control unit in FIG. 1.

FIG. 2 is a structural diagram of the control unit in FIG. 1. As shown in FIG. 2, the control unit may include a first transistor T1, a second transistor T2 and a capacitor C1; a control electrode of the first transistor T1 is connected with a first electrode of the first transistor T1 and also connected with a signal output end Output_n of the last stage shift register of the previous GOA unit group, a second electrode of the first transistor T1 is connected with a first end of the capacitor C1 and a control electrode of the second transistor T2; a first electrode of the second transistor T2 is connected with a start control signal output end RE1, and a second electrode of the second transistor T2 is connected with the signal input end Input_n+1 of the first stage shift register of the next GOA unit group; a second end of the capacitor C1 is grounded, or connected with a first power supply end; and the start control signal output end RE1 is configured to output the start control signal.

It should be noted that FIG. 2 only illustrates the case that the second end of the capacitor C1 is connected with the first power supply end that is a low level power supply end. The second end of the capacitor C1 may also be grounded, which is not illustrated in the figures.

Optionally, the control unit may further include a first reset module 3; the first reset module 3 is connected with the first end of the capacitor C1 and a signal output end Output_n+1 of the first stage shift register of the next GOA unit group; and the first reset module 3 is configured to reset the first end of the capacitor C1 under the control of a signal output from the signal output end Output_n+1 of the first stage shift register of the next GOA unit group.

Further optionally, the first reset module may include a third transistor T3; a control electrode of the third transistor T3 is connected with the signal output end Output_n+1 of the first stage shift register of the next GOA unit group, a first electrode of the third transistor T3 is connected with a second power supply end, and a second electrode of the third transistor T3 is connected with the first end of the capacitor C1.

It should be noted that the second power supply end in the present embodiment is a lower level power supply end.

Optionally, the control unit may further include a second reset module 4; the second reset module 4 is connected with the signal input end Input_n+1 of the first stage shift register of the next GOA unit group; and the second reset module 4 is configured to reset the signal input end Input_n+1 of the first stage shift register of the next GOA unit group, after the control unit completes the pre-charge of the first stage shift register of the next GOA unit group.

Further optionally, the second reset module 4 may include a fourth transistor T4; a control electrode of the fourth transistor T4 is connected with a reset control signal end RE2, a first electrode of the fourth transistor T4 is connected with a third power supply end, and a second electrode of the fourth transistor T4 is connected with the signal input end Input_n+1 of the first stage shift register of the next GOA unit group.

It should be note that the third power supply end in the present embodiment is a low level power supply end.

It should also be noted that the first power supply end, the second power supply end and the third power supply end in the present embodiment may be a single power supply end such as a power supply end VGL illustrated in FIG. 2, which is a low level power supply end configured to output a low level voltage.

Next, the operational procedure of the control unit illustrated in FIG. 2 will be described in detail with reference to the figures. It should be noted that, for easily understanding the technical solutions of the present application by those skilled in the art, in the present application, a voltage corresponding to a high level output from each of the shift registers is defined as Vgh_1, a voltage corresponding to a high level output from the start control signal output end RE1 is defined as Vgh_2, and a voltage corresponding to a low level output from each of the output ends in the present application is defined as Vgl.

Figure 3:
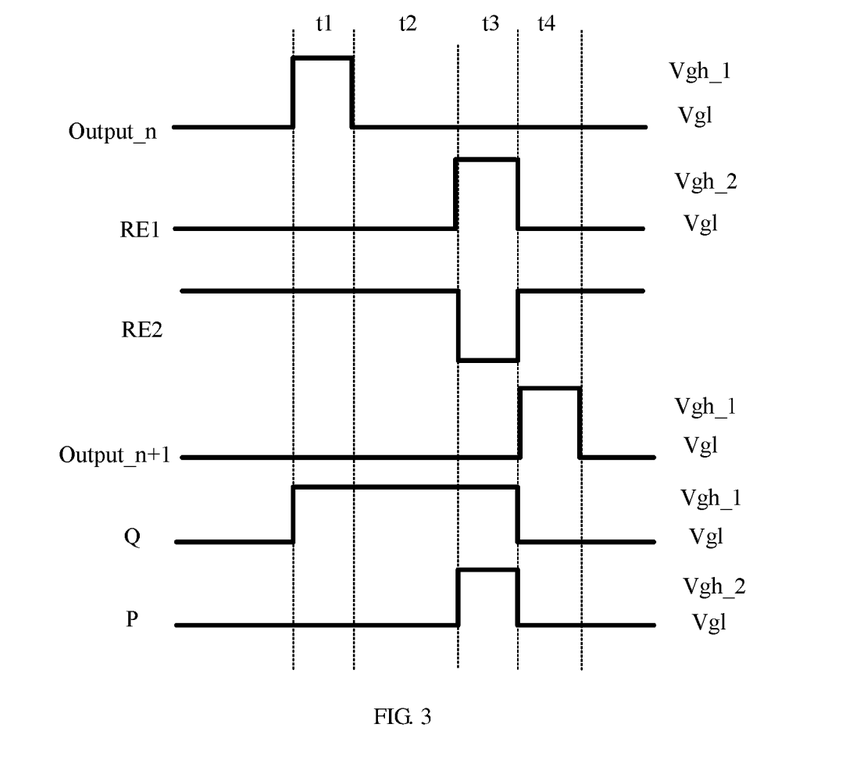
FIG. 3 is a sequence diagram of operation of the control unit illustrated in FIG. 2.

FIG. 3 is a sequence diagram of operation of the control unit illustrated in FIG. 2. As shown in FIG. 3, the operation procedure of the control unit can be divided into four different stages t1 to t4.

In the first stage t1, the start control signal output end RE1 outputs a low level, and the reset control signal end RE2 outputs a high level.

It should be noted that each of the start control signal output end RE1 and the reset control signal end RE2 is an output end of a driving chip that generates the start control signal and the reset control signal, and these signals are transmitted to the control unit through the start control signal output end RE1 and the reset control signal end RE2, respectively.

In the first stage, the last stage shift register of the previous GOA unit group performs driving on a corresponding gate line, and outputs a high level from the signal output end Output_n thereof, so that a node Q is at the high level, a voltage of which is Vgh_1. At this time, a voltage at the first end of the capacitor C1 is Vgh_1, a voltage at the second end of the capacitor C1 is Vgl, and the difference between the voltages at both ends of the capacitor C1 is Vgh_1–Vgl.

As the node Q is at the high level, the second transistor T2 is turned on; and as the start control signal output end RE1 outputs a low level and the reset control signal end RE2 outputs a high level, the fourth transistor T4 is turned on. Therefore, a voltage at a node P is Vgl.

In the second stage t2, duration of the second stage is the predetermined time. The start control signal output end RE1 outputs a low level, and the reset control signal end RE2 outputs a high level.

In the second stage, the signal output end Output_n of the last stage shift register of the previous GOA unit group outputs a low level, so that the first transistor T1 is turned off. However, as the existence of the capacitor C1, the voltage at the node Q remains as Vgh_1, and the voltage difference between both ends of the capacitor C1 remains as Vgh_1–Vgl. The second transistor T2 and the fourth transistor T4 are in the same state as in the first stage, and the voltage at the node P is Vgl.

In the second stage, it can be regarded that the display stage is temporarily interrupted, and at this time, a touch driving can be performed on the touch display device by using the touch driving circuit, thereby increasing the time for the touch driving on the touch display panel, which in turn ensures that the touch function can be performed normally. Details of the procedure of touch driving realized by the touch display panel are omitted herein.

In the third stage t3, the start control signal output end RE1 outputs a high level, and the reset control signal end RE2 outputs a low level.

In the third stage, the second transistor T2 remains turned-on as the node Q is at a high level (of a voltage Vgh_1). Meanwhile, as the reset control signal end RE2 outputs a low level, the fourth transistor T4 is turned off. At this time, the start control signal that is in the high level state is output to the signal input end Input_n+1 of the first stage shift register of the next GOA unit group through the second transistor T2, so as to pre-charge the first stage shift register of the next GOA unit group, and ensures that the first stage shift register of the next GOA unit group can perform normal driving. At this time, the voltage at the node P is changed to Vgh_2.

In the fourth stage t4, the start control signal output end RE1 outputs a low level, and the reset control signal end RE2 outputs a high level.

In the fourth stage, the first stage shift register of the next GOA unit group performs driving on a corresponding gate line, and outputs a high level from the signal output end Output_n+1 thereof, so that the third transistor T3 is turned on, the voltage at the node Q is changed to Vgl and the first end of the capacitor C1 is reset, and at this time, the second transistor T2 is turned off.

Meanwhile, as the reset control signal end RE2 outputs a high level, the fourth transistor T4 is turned on again, the voltage at the node P is changed to Vgl, and the signal input end Input_n+1 of the first stage shift register of the next GOA unit group is reset.

From above content it can be seen that the technical solution of the present invention can perform touch driving within the "predetermined time" by using the touch driver circuit, in the process of driving shift registers in two adjacent stages by the gate driver circuit, so as to realize normal touch recognition in the touch stage on the premise of effectively ensuring that the touch display device can perform normal display in the display stage.

Figure 4:
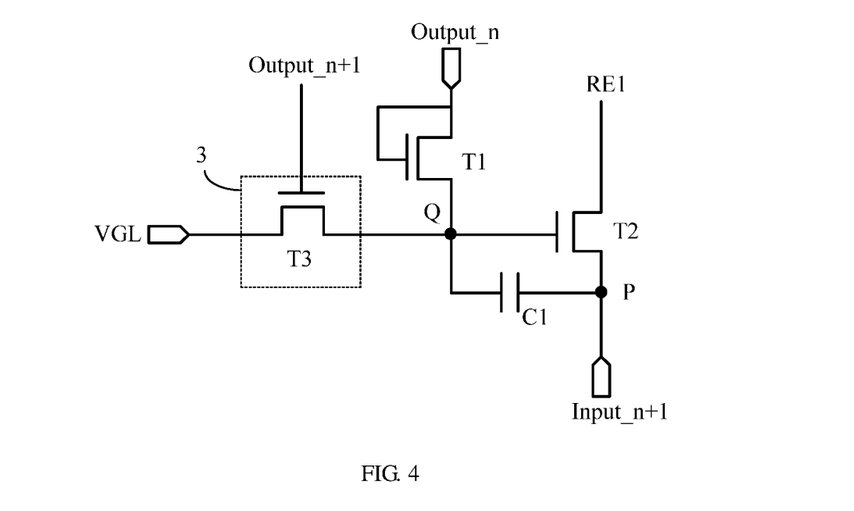
FIG. 4 is another structural diagram of the control unit in FIG. 1.
Figure 5:
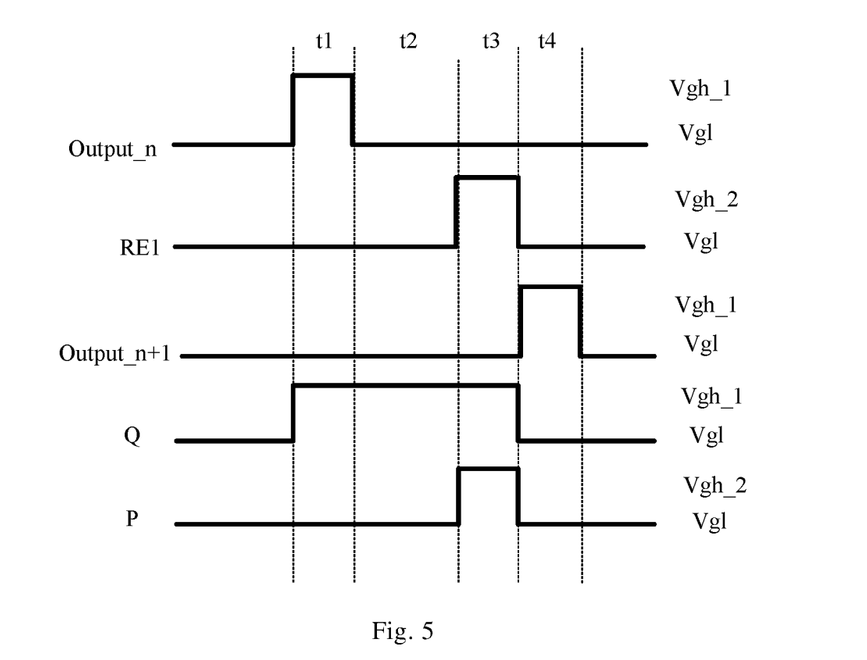
FIG. 5 is a sequence diagram of operation of the control unit illustrated in FIG. 4.

FIG. 4 is another structural diagram of the control unit in FIG. 1, and FIG. 5 is a sequence diagram of operation of the control unit illustrated in FIG. 4. As shown in FIGS. 4 and 5, the difference between the control unit illustrated in FIG. 4 and the control unit illustrate in FIG. 2 is in that: in FIG. 4, the first end of the capacitor C1 is connected with the second electrode of the first transistor T1 and the control electrode of the second transistor T2, and the second end of the capacitor C1 is connected with the second electrode of the second transistor T2.

The operation procedure of the control unit illustrated in FIG. 4 may also be divided into four different stages t1 to t4.

In the first stage t1, the start control signal output end RE1 outputs a low level.

In the first stage, the last stage shift register of the previous GOA unit group performs driving on a corresponding gate line, and outputs a high level from the signal output end Output_n thereof, so that a node Q is at a high level, a voltage of which is Vgh_1.

As the node Q is at the high level, the second transistor T2 is turned on; and as the start control signal output end RE1 outputs a low level, a voltage at a node P is Vgl. At this time, a voltage at the first end of the capacitor C1 is Vgh_1, a voltage at the second end of the capacitor C1 is Vgl, and the difference between the voltages at both ends of the capacitor C1 is Vgh_1−Vgl.

In the second stage t2, duration of the second stage is the predetermined time. The start control signal output end RE1 outputs a low level.

In the second stage, the signal output end Output_n of the last stage shift register of the previous GOA unit group outputs a low level, so that the first transistor T1 is turned off. However, as the existence of the capacitor C1, the voltage at the node Q remains as Vgh_1, the second transistor T2 is in the same state as in the first stage, the voltage at the node P is Vgl, and the voltage difference between both ends of the capacitor C1 remains as Vgh_1−Vgl.

In the second stage, it can be regarded that driving in the display stage is temporarily interrupted, and at this time, a touch driving can be performed on the touch display device by using the touch driving circuit, thereby increasing the time for the touch driving on the touch display panel, which in turn ensures that the touch function can be performed normally.

In the third stage t3, the start control signal output end RE1 outputs a high level.

In the third stage, the second transistor T2 remains turned-on as the node Q is at a high level (of a voltage Vgh_1). At this time, the start control signal that is in the high level state is output to the signal input end Input_n+1 of the first stage shift register of the next GOA unit group through the second transistor T2, so as to pre-charge the first stage shift register of the next GOA unit group, and ensures that the first stage shift register of the next GOA unit group can perform normal driving. At this time, the voltage at the node P is changed to Vgh_2. At this time, the voltage at the first end of the capacitor C1 is Vgh_1, the voltage at the second end of the capacitor C1 is Vgh_2, and the voltage difference between both ends of the capacitor C1 is Vgh_1−Vgh_2.

In the fourth stage t4, the start control signal output end RE1 outputs a low level.

In the fourth stage, the first stage shift register of the next GOA unit group performs driving on a corresponding gate line, and outputs a high level from the signal output end Output_n+1 thereof, so that the third transistor T3 is turned on, the voltage at the node Q is changed to Vgl and the first end of the capacitor C1 is reset, and at this time, the second transistor T2 is turned off.

As the voltage at the first end of the capacitor C1 is changed to Vgl, the voltage at the second end of the capacitor C1 is changed to Vgh_1−Vgh_2+Vgl due to bootstrap of the capacitor C1. In actual operations, as Vgh_1 is approximately equal to Vgh_2, the voltage at the second end of the capacitor C1 can be approximately regarded as Vgl, and the signal input end Input_n+1 of the first stage shift register of the next GOA unit group is reset.

Compared to the control unit illustrated in FIG. 2, the control unit illustrated in FIG. 4 can realize the reset of the signal input end Input_n+1 of the first stage shift register of the next GOA unit group by connecting the second end of the capacitor C1 and the second electrode of the second transistor T2, in the case where a signal control line (the reset control signal end RE2) and a transistor (the fourth transistor T4) are omitted, that is, it is unnecessary to provide the second reset module, thereby effectively reducing the complexity of the circuit.

From above content it can be seen that the technical solution of the present invention can perform touch driving within the "predetermined time" by using the touch driver circuit, in the process of driving shift registers in two adjacent stages by the gate driver circuit, so as to realize normal touch recognition in the touch stage on the premise of effectively ensuring that the touch display device can perform normal display in the display stage.

Embodiments of the present invention further provide a touch display device comprising the above-described gate driver circuit, details of which may refer to the above description.

Embodiments of the present invention further provide a touch display driving method based on a touch display device comprising the above-described gate driver circuit and a touch driver circuit.

The touch display driving method comprises steps of:

in a first stage, driving a corresponding gate line by the last stage shift register of the previous GOA unit group, and outputting a voltage signal output from the signal output end of the last stage shift register of the previous GOA unit group to the control unit;

in a second stage, performing a touch driving on the touch display device by the touch driver circuit, wherein duration of the second stage is the predetermined time; and in a third stage, outputting a start control signal at a high level to the signal input end of the first stage shift register of the next GOA unit group by the control unit under the control of the stored voltage signal output from the last stage shift register of the previous GOA unit group, so as to pre-charge the first stage shift register of the next GOA unit group.

Optionally, after the third stage, the touch display driving method may further comprise the step of:

in a fourth stage, driving a corresponding gate line by the first stage shift register of the next GOA unit group.

It should be noted that specific procedure of the above four stages can refer to the above corresponding description, and will not be repeated herein.

The touch display driving method provided in the present invention can perform touch driving within the "predetermined time" by using the touch driver circuit, in the process of driving shift registers in two adjacent stages by the gate driver circuit, so as to realize normal touch recognition in the touch stage on the premise of effectively ensuring that the touch display device can perform normal display in the display stage.

It should be noted that the foregoing implementations are only exemplary embodiments used for illustrating the principle of the present invention, but the present invention is not limited thereto. Various modifications and improvements can be made for those skilled in the art without departing from the spirit and essence of the present invention. These modifications and improvements shall also be regarded as the protection scope of the present invention.

What is claimed is:

1. A gate driver circuit, comprising a plurality of GOA unit groups arranged successively and control units arranged between every two adjacent GOA unit groups, each of the GOA unit groups comprising a plurality of shift registers which are cascaded, wherein, the control unit is configured to output a start control signal at a high level to a signal input end of a first stage shift register of a next GOA unit group corresponding thereto, after a last stage shift register of a previous GOA unit group corresponding thereto completes driving for a corresponding gate line and a predetermined time elapses, so as to pre-charge the first stage shift register of the next GOA unit group, and wherein the control unit comprises a first transistor, a second transistor and a capacitor;

a control electrode of the first transistor is connected with a first electrode of the first transistor and also connected with a signal output end of the last stage shift register of the previous GOA unit group, a second electrode of the first transistor is connected with a first end of the capacitor and a control electrode of the second transistor;

a first electrode of the second transistor is connected with a start control signal output end, and a second electrode of the second transistor is connected with the signal input end of the first stage shift register of the next GOA unit group;

a second end of the capacitor is grounded, or connected with a first power supply end, or connected with the second electrode of the second transistor; and the start control signal output end is configured to output the start control signal.

2. The gate driver circuit according to claim 1, wherein the control unit further comprises a first reset module;

the first reset module is connected with the first end of the capacitor and a signal output end of the first stage shift register of the next GOA unit group; and the first reset module is configured to reset the first end of the capacitor under the control of a signal output from the signal output end of the first stage shift register of the next GOA unit group.

3. The gate driver circuit according to claim 2, wherein the first reset module comprises a third transistor;

a control electrode of the third transistor is connected with the signal output end of the first stage shift register of the next GOA unit group, a first electrode of the third transistor is connected with a second power supply end, and a second electrode of the third transistor is connected with the first end of the capacitor.

4. The gate driver circuit according to claim 1, wherein in the case where the second end of the capacitor is grounded, or connected with the first power supply end:

the control unit further comprises a second reset module;
the second reset module is connected with the signal input end of the first stage shift register of the next GOA unit group; and
the second reset module is configured to reset the signal input end of the first stage shift register of the next GOA unit group, after the control unit completes the pre-charge of the first stage shift register of the next GOA unit group.

5. The gate driver circuit according to claim 4, wherein the second reset module comprises a fourth transistor;

a control electrode of the fourth transistor is connected with a reset control signal end, a first electrode of the fourth transistor is connected with a third power supply end, and a second electrode of the fourth transistor is connected with the signal input end of the first stage shift register of the next GOA unit group.

6. A touch display device, comprising the gate driver circuit according to of claim 1.

7. The touch display device according to claim 6, wherein the control unit further comprises a first reset module;

the first reset module is connected with the first end of the capacitor and a signal output end of the first stage shift register of the next GOA unit group; and
the first reset module is configured to reset the first end of the capacitor under the control of a signal output from the signal output end of the first stage shift register of the next GOA unit group.

8. The touch display device according to claim 7, wherein the first reset module comprises a third transistor;

a control electrode of the third transistor is connected with the signal output end of the first stage shift register of the next GOA unit group, a first electrode of the third transistor is connected with a second power supply end, and a second electrode of the third transistor is connected with the first end of the capacitor.

9. The touch display device according to claim 6, wherein in the case where the second end of the capacitor is grounded, or connected with the first power supply end:

the control unit further comprises a second reset module;
the second reset module is connected with the signal input end of the first stage shift register of the next GOA unit group; and
the second reset module is configured to reset the signal input end of the first stage shift register of the next GOA unit group, after the control unit completes the pre-charge of the first stage shift register of the next GOA unit group.

10. The gate driver circuit according to claim 9, wherein the second reset module comprises a fourth transistor;

a control electrode of the fourth transistor is connected with a reset control signal end, a first electrode of the fourth transistor is connected with a third power supply end, and a second electrode of the fourth transistor is connected with the signal input end of the first stage shift register of the next GOA unit group.

11. A touch display driving method based on a touch display device comprising the gate driver circuit according to claim 1, and a touch driver circuit, comprising steps of:

in a first stage, driving a corresponding gate line by the last stage shift register of the previous GOA unit group, and outputting a voltage signal output from the signal output end of the last stage shift register of the previous GOA unit group to the control unit;

in a second stage, performing a touch driving on the touch display device by the touch driver circuit, wherein duration of the second stage is the predetermined time; and in a third stage, outputting the start control signal at a high level to the signal input end of the first stage shift register of the next GOA unit group by the control unit under the control of the stored voltage signal output from the last stage shift register of the previous GOA unit group, so as to pre-charge the first stage shift register of the next GOA unit group.

12. The display touch driving method according to claim 11, wherein after the third stage, the method further comprises a step of:

in a fourth stage, driving a corresponding gate line by the first stage shift register of the next GOA unit group.

* * * * *